United States Patent [19]

Chihara

[11] Patent Number: 5,307,435
[45] Date of Patent: Apr. 26, 1994

[54] PHOTOSEMICONDUCTOR DEVICE MOUNTING RECEPTACLE

[75] Inventor: Eiji Chihara, Adachi, Japan

[73] Assignee: Adamant Kogyo Company Ltd., Tokyo, Japan

[21] Appl. No.: 995,019

[22] Filed: Dec. 22, 1992

[51] Int. Cl.⁵ .......................... G02B 6/00; G02B 6/36
[52] U.S. Cl. ...................................................... 385/92
[58] Field of Search .......................................... 385/80-95

[56] References Cited

U.S. PATENT DOCUMENTS

| | | | |
|---|---|---|---|
| 4,186,996 | 2/1980 | Bowen et al. | 385/92 |
| 4,708,433 | 11/1987 | Kakii et al. | 385/59 X |
| 4,737,011 | 4/1988 | Iri et al. | 385/78 |
| 4,834,494 | 5/1989 | DeMeritt et al. | 385/61 |
| 4,997,243 | 3/1991 | Aiki et al. | 385/92 |
| 4,997,252 | 3/1991 | Sugawara et al. | 385/92 X |
| 5,073,047 | 12/1991 | Suzuki et al. | 385/93 |
| 5,119,462 | 6/1992 | Matsubara et al. | 385/93 |
| 5,121,455 | 6/1992 | Palecek | 385/66 X |
| 5,127,074 | 6/1992 | Watanabe et al. | 385/93 |
| 5,189,716 | 2/1993 | Matsubara et al. | 385/93 |

FOREIGN PATENT DOCUMENTS 3-38605  2/1991  Japan .
3-153203  7/1991  Japan .

*Primary Examiner*—Akm E. Ullah
*Attorney, Agent, or Firm*—Sherman and Shalloway

[57] ABSTRACT

A photosemiconductor device mounting receptor, comprising a main body (11) having an insertion hole (15), a sleeve (12) having an optical connector insertion hole (14), and a sleeve supporter (13) for supporting securely the sleeve (12), wherein the sleeve (12) is positioned in the main body (11), and the insertion hole (15) of the main body (11) and the optical connector insertion hole (14) of the sleeve (12) are arranged to be on the same optical axis. The main body (11) and the sleeve supporter (13) are integrally connected by molding, and the main body (11) of a synthetic resin obtained by this molding is formed to cover the circumference of the sleeve (12) supported by the sleeve supporter (13).

5 Claims, 4 Drawing Sheets

PHOTOSEMICONDUCTOR DEVICE MOUNTING RECEPTACLE

FIELD OF THE INVENTION

The present invention relates to a photosemiconductor device mounting receptacle for coupling optically a photosemiconductor device to an optical fiber.

BACKGROUND OF THE INVENTION

A conventional general structure of a photosemiconductor module used, for example, in optical communication is shown in FIG. 7. In FIG. 7, reference numeral 1 indicates a main body, reference numeral 2 indicates a sleeve, and reference numeral 3 indicates a photosemiconductor device housing. The sleeve 2 has one end inserted into a sleeve supporter 4 and fixed therein and the sleeve supporter 4 is fixed to the main body 1 by welding or the like. The sleeve 2 is positioned at the center of an insertion hole 5 with the sleeve 2 out of contact with the inner wall of the insertion hole 5. The photosemiconductor device housing 3 is attached securely on the sleeve supporter side of the thus constituted receptacle 6 and an optical connector (not shown) is attached securely on the sleeve side by inserting it into the sleeve 2.

In the conventional receptacle, to attach securely the sleeve supporter 4 in which the sleeve 2 is securely inserted to the main body 1, the sleeve supporter 4 is welded to the main body, or an attaching hole is drilled in the main body and the sleeve supporter 4 is pressed into the attaching hole. In the case of welding, since it is difficult to weld the sleeve supporter to the main body so that the sleeve may be positioned at the center precisely, there is a risk that displacement will occur highly, the assembling work is quite cumbersome, and the manufacturing cost is high. There also arises a problem of corrosion at the welded site by oxidation, leading to a defect that the durability is poor.

In the case of securing the sleeve supporter by pressing, the sleeve 2 is fixed in the insertion hole 5 of the main body with the sleeve 2 slightly inclined depending on the degree of the exerted force due to the fitting tolerance, and similarly there is a fear that displacement will occur. Thus, conventionally, to fix the sleeve supporter to the main body, a problem of displacement occurs, and as a result when a connector is inserted, a properly inserted state cannot be obtained, and there is a fear that every time the connector is inserted a change in the optical coupling occurs. Further, as a result of the inclined arrangement of the sleeve, also there is a fear that the adjustment of the optical axis at the time of the assembling is hindered.

Further, in the conventional receptacle, since the main body 1 and the sleeve supporter 4 are made of metal materials, a troublesome operation that the metal materials are cut and machined to produce the main body 1 and the sleeve supporter 4 is needed, and also an assembling operation for assembling them is needed, leading to economically disadvantageous defects that the production cost is high and the receptacle is not suitable for mass production.

SUMMARY OF THE INVENTION

An object of the present invention is to provide a receptacle wherein a sleeve can be positioned precisely in a main body so that an insertion hole for insertion of an optical connector provided in the main body and an optical connector insertion hole in the sleeve may form a single straight path whereby the insertion hole in the main body and the optical connector insertion hole in the sleeve can be arranged at all times on the same optical axis.

Another object of the present invention is to provide a receptacle which can be easily produced and is suitable for mass production.

The present photosemiconductor device mounting receptor comprises a sleeve having an optical connector insertion hole, and a sleeve supporter for supporting securely said sleeve, wherein a main body of a synthetic resin is formed integrally around the sleeve by molding and is provided with an insertion hole in communication with the optical connector insertion hole of the sleeve.

When the sleeve supporter by which the sleeve is securely supported is set in a molding tool and a resin is injected into the molding tool and is molded, an integrally molded item made up of the main body and the sleeve supporter can be obtained.

By this molding, the sleeve can be placed in a proper position in the main body and as a result the insertion hole of the main body and the optical connector insertion hole of the sleeve can be arranged on the same optical axis precisely.

BRIEF DESCRIPTION OF THE DRAWINGS

The objects and effects of the present invention will become apparent from the following detailed description with reference to the accompanying drawings, wherein:

FIG. 3 shows the state before a resin is injected, and FIG. 4 shows the state after the resin is injected;

DETAILED DESCRIPTION OF THE INVENTION

The receptacle comprises a main body, a sleeve, and a sleeve supporter, and the sleeve is positioned in the main body with the the sleeve supported securely by the sleeve supporter.

Figure 1:
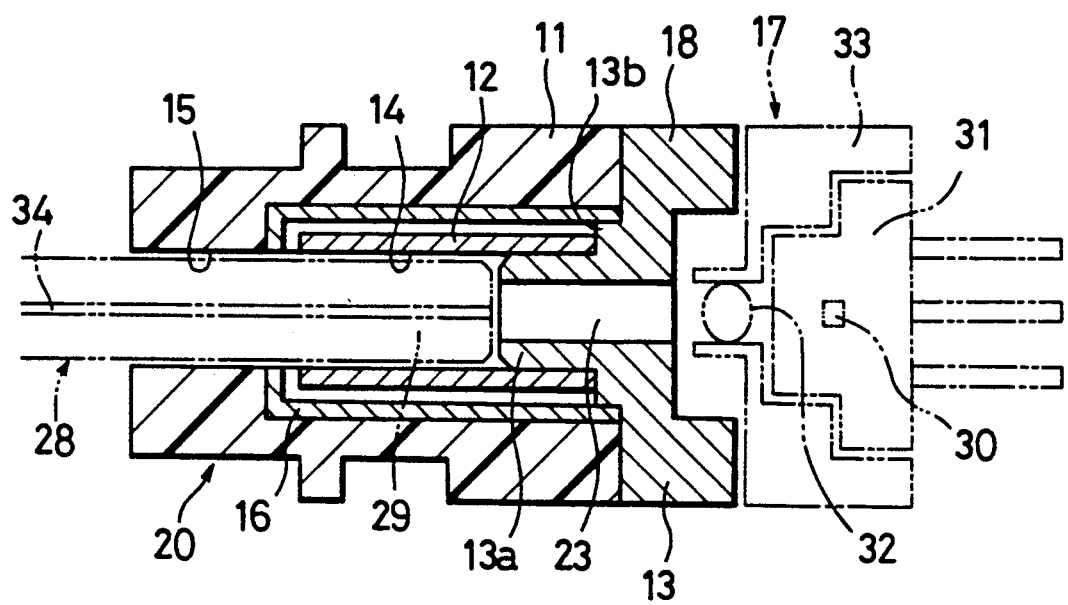
FIG. 1 is a longitudinal sectional view showing one embodiment of the present receptacle.

In FIG. 1, an embodiment of the present receptacle is shown, reference numerals 11, 12, and 13 indicate the main body, the sleeve, and the sleeve supporter respectively. The sleeve 12 is in the shape of a cylinder and has an optical connector insertion hole 14, and by fitting one end of the sleeve 12 on a projection 13a of the sleeve supporter 13 with that end aligned with the axis of the sleeve supporter 13, the sleeve 12 is supported securely by the sleeve supporter 13. The sleeve 12 and the sleeve supporter 13 are made of a metal such as a stainless steel and Permalloy. The main body 11 of a synthetic resin is formed around the sleeve 12 by molding. When the main body 11 is molded, the main body 11 is connected integrally with the sleeve supporter 13 supporting securely the sleeve 12 and covers the circumference of the sleeve 12.

As an example of the resin constituting the main body 11, a polycarbonate can be mentioned. The main body 11 is provided with an insertion hole 15 in communication with the optical connector insertion hole 14 of the sleeve. Reference numeral 16 indicates a shielding member which is formed for preventing the injected resin at the time of the molding from flowing into the sleeve and the shielding member 16 covers the circumference of the sleeve 12 with a gap between the shielding member 16 and the sleeve 12. As the material of the shielding member 16, any material such as a metal material, for example, a stainless steel as well as a ceramic and a synthetic resin can be used. In order to allow a photosemiconductor device housing 17 which will be described later to be welded, the sleeve supporter 13 is provided with a connecting section 18 between the main body 11 and the housing 17.

Figure 2:
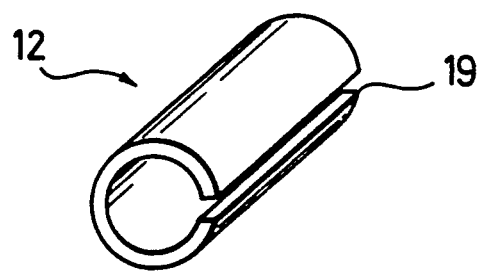
FIG. 2 is a perspective view showing one embodiment of the slotted sleeve used in the present invention.

As is shown in FIG. 2, the sleeve 12 may be a slotted sleeve produced by forming a slot 19 in a cylinder to extend axially thereof or may be a common cylindrical sleeve having no slot. In the case of a slotted sleeve, the slotted sleeve has a diameter slightly smaller than the outer diameter of the plug of the optical connector described later.

Figure 3:
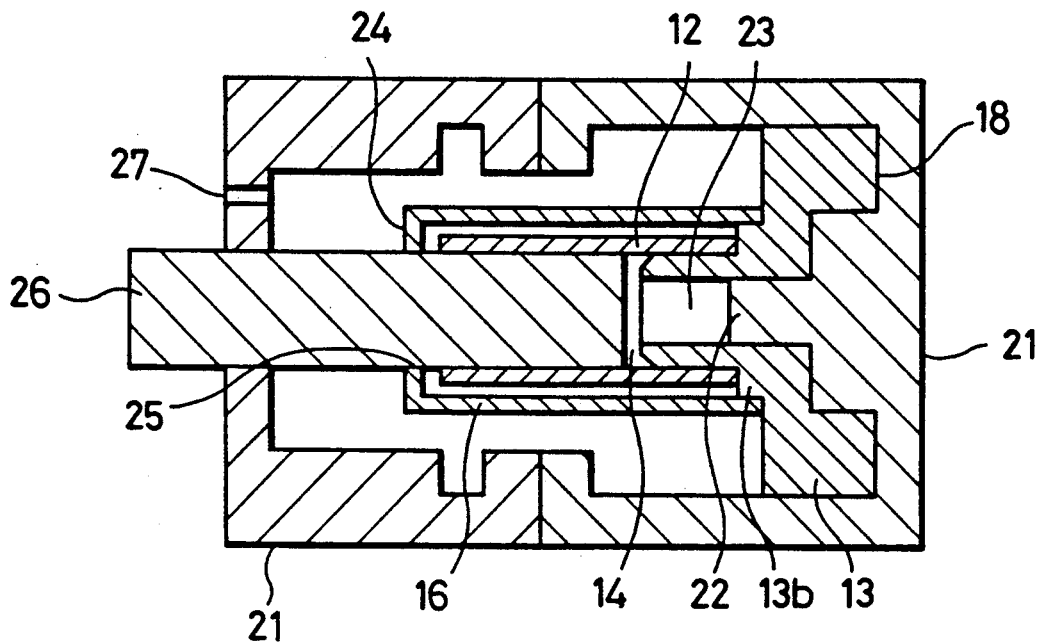
FIGS. 3 and 4 are longitudinal sectional views illustrating a method of producing the present receptacle.
Figure 4:
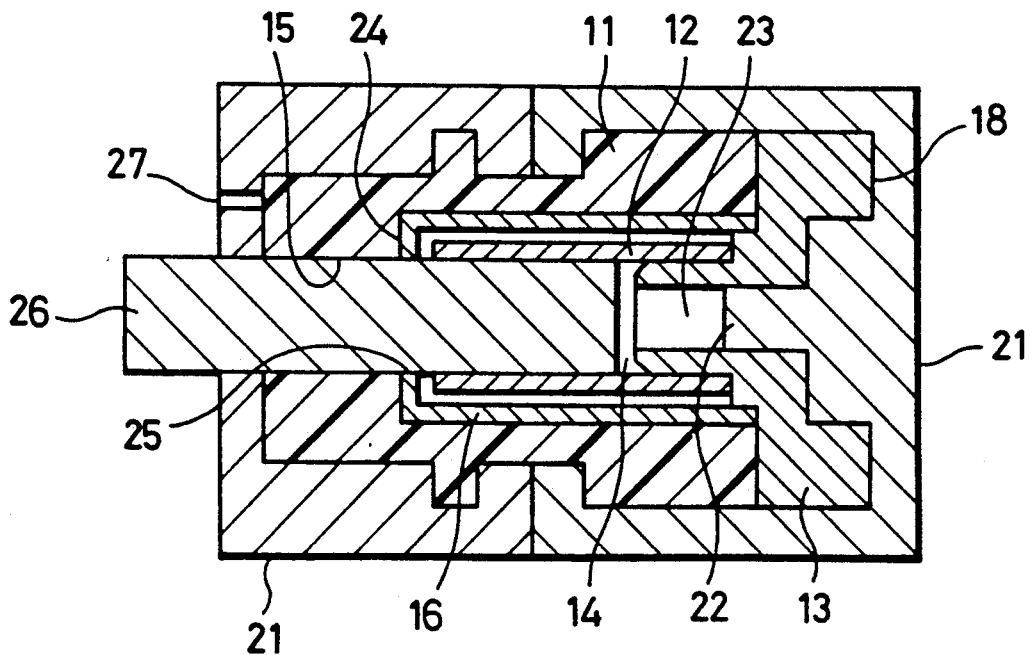

The present receptacle 10 constituted as stated above is produced by a generally known molding method. FIGS. 3 and 4 illustrate one embodiment of its manufacturing method and first as is illustrated in FIG. 3, the sleeve supporter 13 on which one end of the sleeve 12 is put and secured is arranged in a molding tool 21. In this arrangement, an optical path formation hole 23 of the sleeve supporter 13 is put on a protuberance 22 positioned at the axis of the molding tool so that the optical path formation hole 23 may be positioned securely.

Then, the generally cylindrical shielding member 16 is attached to cover the whole of the circumference of the sleeve 12. One end of the shielding member 16 is an open end and the other end is formed into a shielding wall 24 which is formed with an opening section 25. On the other hand, the base end section of a columnar pin 26 having a prescribed length is fixed to the molding tool 21 with the length of the the columnar pin 26 being extended in the same direction as that of the sleeve 12, the pin 26 is inserted into the opening section 25 of the shielding member 16, and the open end of the shielding member 16 is fitted on the stepped section 13b of the sleeve supporter 13. In this way, the shielding member 16 is supported by the pin 26 and the sleeve supporter 13 to be secured in position.

Further, the pin 26 is also inserted through the opening section 25 of the shielding member 16 into the optical connector insertion hole 14 of the sleeve 12. Therefore, the sleeve 12 and the sleeve supporter 13 are also supported securely in the molding tool by the pin 26. The molding tool 21 is designed in such a manner that the axis of the molding tool 21, the axis of the protuberance 22, and the axis of the pin 26 are in line.

As described above, after the sleeve supported by the sleeve supporter 13 is arranged in the molding tool 21, a melted resin is injected from an injection port 27 and is molded into the main body 11 with a prescribed shape as shown in FIG. 4. The injection port may be situated in a suitable position by taking the flow of the resin at the time of the molding into consideration. Although the resin injected into the molding tool flows into the resin path defining the main body 11, since the circumference of the sleeve 12 is covered with the shielding member 16 and the opening section 25 of the shielding member 16 is closed by the pin 26, the resin is prevented from flowing into the sleeve 12. The main body 11 molded out of the injected resin is joined integrally to the shielding member 16 and the sleeve supporter 13 and thus a molded item having the main body 11 and the sleeve component body joined together is formed.

The photosemiconductor device housing 17 is connected to one end of the thus produced present receptacle and a plug 29 of an optical connector 28 is inserted into the other end, so that a photosemiconductor device module is formed. The photosemiconductor device housing 17 comprises a photosemiconductor device package 31 wherein a photosemiconductor 30 is sealed off and a lens support frame 33 to which a lens 32 is mounted, and to attach the housing 17 to the present receptacle, after the optical axes, the x axis, y axis, and z axis, are adjusted between the housing 17 and the optical fiber, the housing 17 is joined securely to the present receptacle, for example, by means of laser welding.

The plug 29 of the optical connector 28 comprises an optical fiber 34 inserted into and integrally bonded to a fine hole at the center of the plug and the end surface of the plug 29 is finished by abrasion to have an optical surface. The plug 29 is inserted through the insertion hole 15 of the main body 11 into the optical connector insertion hole 14 of the sleeve 12. The photosemiconductor 30 may be a semiconductor light emitting device such as LD (laser diode) and LED (light emitting diode) or a semiconductor light receptive device such as PD (photodiode).

In the molding tool used in producing the present receptacle, instead of the pin 26 a protuberance may be formed on the inner wall of the molding tool to act as that pin 26.

Figure 5:
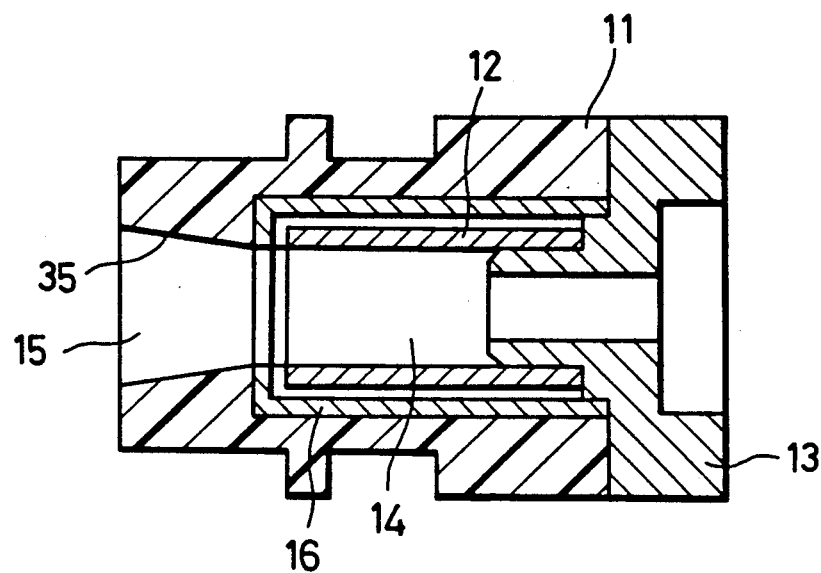
FIG. 5 is a longitudinal sectional view showing another embodiment of the present receptacle.

As another embodiment of the present receptacle, the insertion hole 15 of the main body 11 may have diameters which are increased from the inside toward the outside as is shown in FIG. 5. Accordingly, in such a structure, the insertion hole 15 has an inclined surface 35.

Figure 6:
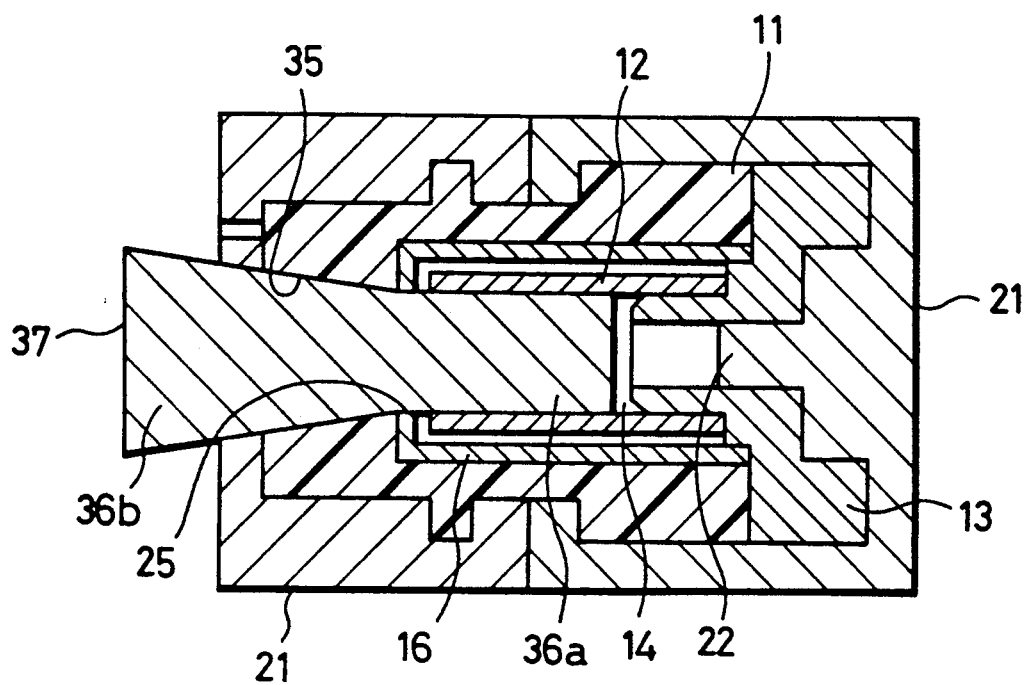
FIG. 6 is a longitudinal sectional view illustrating a method of producing that receptacle shown in FIG. 5.
Figure 7:
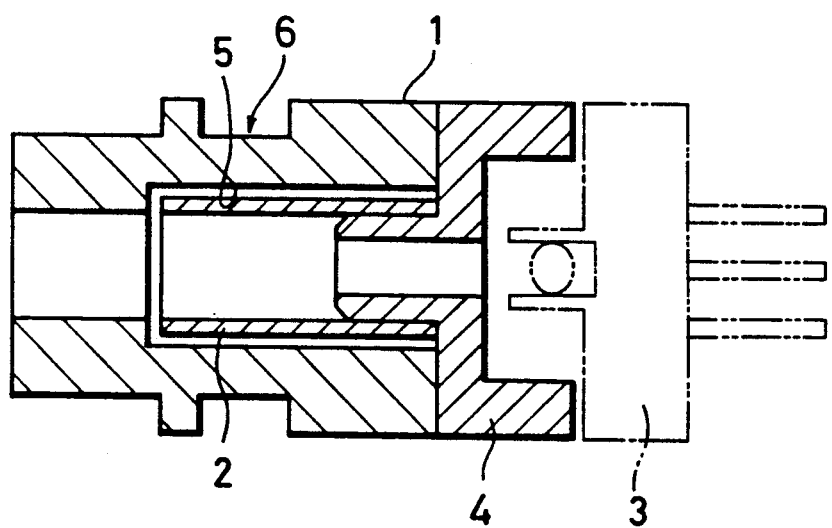
FIG. 7 is a longitudinal sectional view illustrating a conventional receptacle.

To produce such a structure, as is shown in FIG. 6, the molding tool 21 includes a pin 27 comprising a constant-diameter section 36a and a differentiated-diameter section 36b is used. The constant-diameter section 36a of said pin is inserted into the optical connector insertion hole 14 of the sleeve and closes the opening section 25 of the shielding member 16. The differentiated-diameter section 36b is positioned outside of the forward end of the shielding member 16. Then, a resin is injected to carry out the molding. In this molding tool in this embodiment, the design is made in such a manner that the axis of the molding tool 21, the axis of the protuberance 22, and the axis of the pin 37 are in line.

ADVANTAGES OF THE INVENTION

Since, in the present receptacle, the main body is formed by molding a synthetic resin, the production of the receptacle excludes need of the operation of welding or pressing the sleeve supporter to the main body as in the prior art, so that the defect that the secured position of the sleeve is inclined or is displaced whereby causing an error of the assembling can be obviated and the sleeve can be placed all the time on the same optical axis.

As a result, when an optical connector is joined, a properly inserted state can be obtained, and there is no fear that a change in the optical coupling occurs every time the optical connector is inserted.

Further, since the sleeve can be arranged on the same optical axis at all times, the adjustment of the optical axis at the time of assembling can be carried out easily.

Since in the present receptacle the main body is formed by molding, the production is easy and is suitable for mass production, and therefore there is an effect that the cost can be reduced.

Further, if the diameter of the insertion hole of the main body is increased from the inside toward the outside, the plug of the optical connector can be mounted or dismounted smoothly, and therefore occurrence of scars due to friction at the time of mounting or dismounting can be prevented.

What is claimed is:

1. A photosemiconductor device mounting receptor, comprising
    a sleeve (12) having an optical connector insertion hole (14),
    a sleeve supporter (13) for supporting securely said sleeve (12), and
    a main body (11) of a synthetic resin, formed around the (12) sleeve by molding and connected integrally to said sleeve supporter (13), said main body being provided with an insert hole (15) in communication with the optical connector insertion hole (14) of the sleeve (12).

2. A photosemiconductor device mounting receptor as claimed in claim 1, wherein the sleeve (12) is formed into the shape of a cylinder and one end of said sleeve (12) is fitted on a projection (13a) formed on said sleeve supporter (13) to be supported securely by said sleeve supporter (13).

3. A photosemiconductor device mounting receptor as claimed in claim 1, wherein a generally cylindrical shielding member (16) that covers the circumference of the sleeve 12 and whose one end is fitted on a stepped section (13b) of the sleeve supporter (13) is provided.

4. A photosemiconductor device mounting receptor as claimed in claim 3, wherein the main body (11) is integrally connected to the shielding member (16) and the sleeve supporter (13).

5. A photosemiconductor device mounting receptor as claimed in claim 1, wherein the diameter of the insertion hole (15) of the main body (11) is increased successively from the inside toward the outside.

* * * * *